United States Patent
Chen

(10) Patent No.: US 10,103,164 B2
(45) Date of Patent: Oct. 16, 2018

(54) THREE-DIMENSIONAL SEMICONDUCTOR DEVICE

(71) Applicant: MACRONIX INTERNATIONAL CO., LTD., Hsinchu (TW)

(72) Inventor: Shih-Hung Chen, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/290,227

(22) Filed: Oct. 11, 2016

(65) Prior Publication Data

US 2017/0352679 A1    Dec. 7, 2017

(30) Foreign Application Priority Data

Jun. 6, 2016 (TW) .............................. 105117810 A

(51) Int. Cl.

| H01L 27/11582 | (2017.01) |
| --- | --- |
| H01L 27/1157 | (2017.01) |
| H01L 27/11556 | (2017.01) |
| H01L 27/11526 | (2017.01) |
| H01L 27/11524 | (2017.01) |
| H01L 27/11573 | (2017.01) |
| H01L 23/528 | (2006.01) |

(Continued)

(52) U.S. Cl.
CPC .... H01L 27/11582 (2013.01); H01L 23/5286 (2013.01); H01L 27/1157 (2013.01); H01L 27/11524 (2013.01); H01L 27/11526 (2013.01); H01L 27/11556 (2013.01); H01L 27/11565 (2013.01); H01L 27/11573 (2013.01); H01L 27/11575 (2013.01)

(58) Field of Classification Search
CPC ........... H01L 27/11582; H01L 27/1157; H01L 27/11578; H01L 27/11556; H01L 27/11565; H01L 27/11551; H01L 29/66833; G11C 16/0483; G11C 16/10; G11C 2213/71
USPC ...................... 365/185.17; 257/324; 438/268
See application file for complete search history.

(56) References Cited

U.S. PATENT DOCUMENTS

| 2010/0054036 A1* | 3/2010 | Lee ..................... G11C 11/5628 365/185.03 |
| --- | --- | --- |
| 2012/0012921 A1* | 1/2012 | Liu ................... H01L 27/11565 257/326 |

(Continued)

OTHER PUBLICATIONS

TIPO Office Action dated Dec. 23, 2016 in corresponding Taiwan application (No. 105117810).

(Continued)

*Primary Examiner* — Jonathan Han
(74) *Attorney, Agent, or Firm* — McClure, Qualey & Rodack, LLP

(57) ABSTRACT

A 3D semiconductor device is provided, including several memory layers vertically stacked on a substrate, an upper selection layer formed on the memory layers, a lower selection layer formed above the substrate, several strings formed vertically to the memory layers and the substrate, several bit lines parallel to each other and disposed above the substrate. The memory layers are parallel to each other, and the strings are electrically connected to the upper selection layer and the lower selection layer. The bit lines are positioned under the memory layers.

22 Claims, 13 Drawing Sheets

(51) Int. Cl.
*H01L 27/11565* (2017.01)
*H01L 27/11575* (2017.01)

(56) References Cited

U.S. PATENT DOCUMENTS

| | | | |
|---|---|---|---|
| 2014/0056072 A1* | 2/2014 | Hung | G11C 16/0483 365/185.11 |
| 2014/0192584 A1* | 7/2014 | Aritome | G11C 5/063 365/72 |
| 2014/0269077 A1* | 9/2014 | Shih | G11C 16/10 365/185.17 |
| 2015/0221380 A1* | 8/2015 | Lee | G11C 16/10 365/185.11 |

OTHER PUBLICATIONS

Komori, et al.: "Disturbless Flash Memory due to High Boost Efficiency on BiCS Structure and Optimal Memory Film Stack for Ultra High Density Storage Device"; 1-4244-2377-4/08/$20.00 © 2008 IEEE; pp. 851-854.

Kim, et al.: "Multi-Layered Vertical Gate NAND Flash Overcoming Stacking Limit for Terabit Density Storage"; 10A-2; 2009 Symposium on VLSI Technology Digest of Technical Papers; pp. 188-189.

Jang, et al.: "Vertical Cell Array using TCAT(Terabit Cell Array Transistor) Technology for Ultra High Density NAND Flash Memory"; 10A-4; 2009 Symposium on VLSI Technology Digest of Technical Papers; pp. 192-193.

Maeda, et al.: "Multi-stacked 1G cell/layer Pipe-shaped BiCS Flash Memory"; 3-1; 2009 Symposium on VLSI Circuits Digest of Technical Papers; pp. 22-23.

Lue, et al.: "A Novel Double-density, Single-Gate Vertical Channel (SGVC) 3D NAND Flash That is Tolerant to Deep Vertical Etching CD Variation and Possesses Robust Read-disturb Immunity"; 978-1-4673-9894-7/15/$31.00 © 2015 IEEE; pp. 3.2.1-3.2.4.

Parat, et al.: "A Floating Gate Based 3D NAND Technology With CMOS Under Array"; 978-1-4673-9894-7/15/$31.00 © 2015 IEEE; pp. 3.3.1-3.3.4.

* cited by examiner

THREE-DIMENSIONAL SEMICONDUCTOR DEVICE

This application claims the benefit of Taiwan application Serial No. 105117810, filed Jun. 6, 2016, the subject matter of which is incorporated herein by reference.

BACKGROUND

Field of the Invention

The disclosure relates in general to a three-dimensional (3D) semiconductor device, more particularly to a 3D semiconductor device with bit lines and/or string selection lines (SSL) disposed under memory array.

Description of the Related Art

A nonvolatile semiconductor memory device is typically designed to securely hold data even when power is lost or removed from the memory device. Various types of nonvolatile memory devices have been proposed in the related art. Also, manufactures have been looking for new developments or techniques combination for stacking multiple planes of memory cells, so as to achieve greater storage capacity. For example, several types of multi-layer stackable thin-film transistor (TFT) NAND-type flash memory structures have been proposed. Various semiconductor devices with three-dimensional (3D) stacked structures, having single-gate unit cells, double gate unit cells or surrounding gate unit cells, have been provided.

It is desirable to develop a semiconductor device with 3D stacked structure not only with larger number of multiple planes being stacked to achieve greater storage capacity, but also with memory cells having excellent electrical properties (such as reliability of data storage and speed of operation), so that the memory cells can be erased and programmed effectively. Typically, 3D NAND Flash page size is proportional to the number of the bit lines (BL). However, the higher the density of the bit lines in a block of 3D memory array, the larger signal interferences between the adjacent bit lines.

SUMMARY

The disclosure relates to a three-dimensional (3D) semiconductor device. According to the embodied structure of the 3D semiconductor device, the bit lines and/or string selection lines (SSL) are positioned under the memory array, and the disturbance between adjacent bit lines during operation can be significantly reduced.

According to the present disclosure, a three-dimensional (3D) semiconductor device is provided, comprising a plurality of memory layers vertically stacked on a substrate, and the plurality of memory layers being parallel to each other; an upper selection layer formed on the memory layers, and a lower selection layer formed above the substrate; a plurality of strings formed vertically to the memory layers and the substrate, and the strings electrically connected to the upper selection layer and the lower selection layer; and a plurality of bit lines parallel to each other being disposed beneath the memory layers and above the substrate.

According to the present disclosure, another 3D semiconductor device is provided, comprising a plurality of memory layers vertically stacked on a substrate, and the plurality of memory layers being parallel to each other; an upper selection layer formed on the memory layers; a lower selection layer formed beneath the memory layers and above the substrate; and a plurality of strings formed vertically to the memory layers and the substrate, and the strings electrically connected to the upper selection layer and the lower selection layer.

The disclosure will become apparent from the following detailed description of the preferred but non-limiting embodiments. The following description is made with reference to the accompanying drawings.

BRIEF DESCRIPTION OF THE DRAWINGS

FIG. 7A-1 and FIG. 7A-2 are top views of the upper memory array and the bottom memory array of a 3D semiconductor device according to the second embodiment of the present disclosure, respectively.

DETAILED DESCRIPTION

Figure 1:
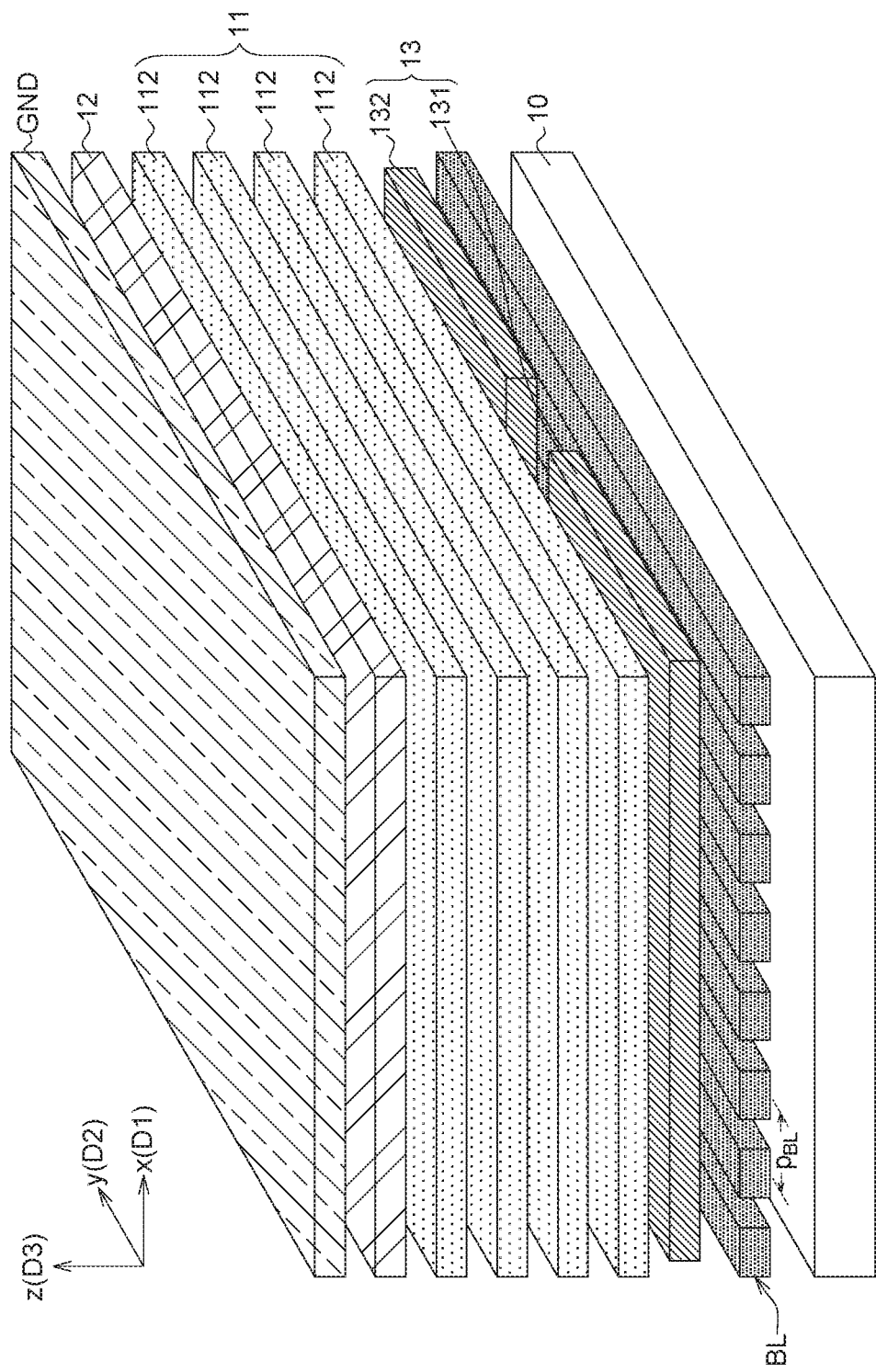
FIG. 1 simply depicts a perspective view of a three-dimensional (3D) semiconductor device according to the first embodiment of the present disclosure.

The embodiments of the present disclosure disclosed below are for elaborating a three-dimensional (3D) semiconductor device, in particular, a 3D semiconductor device with bit lines and/or string selection lines (SSL) under the memory array. According to the design of the embodiments, the BL pitch can be relaxed, thereby enlarging the process window, reducing signal interference between the adjacent BLs and simplifying the manufacturing method.

The disclosure can be applied to various applications with different cell arrays of 3D semiconductor devices, such as vertical-channel (VC) 3D semiconductor devices. Two embodiments are exemplified below for illustration the embodiments of the disclosure. Embodiments are provided hereinafter with reference to the accompanying drawings for describing the related configurations, but the present disclosure is not limited thereto. The identical and/or similar elements of the embodiments are designated with the same and/or similar reference numerals. Also, it is noted that there may be other embodiments of the present disclosure which are not specifically illustrated. It is also important to point out that the illustrations may not be necessarily be drawn to scale. Thus, the specification and the drawings are to be regard as an illustrative sense rather than a restrictive sense.

Moreover, use of ordinal terms such as "first", "second", "third" etc., in the specification and claims to describe an element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

First Embodiment

Figure 2A:
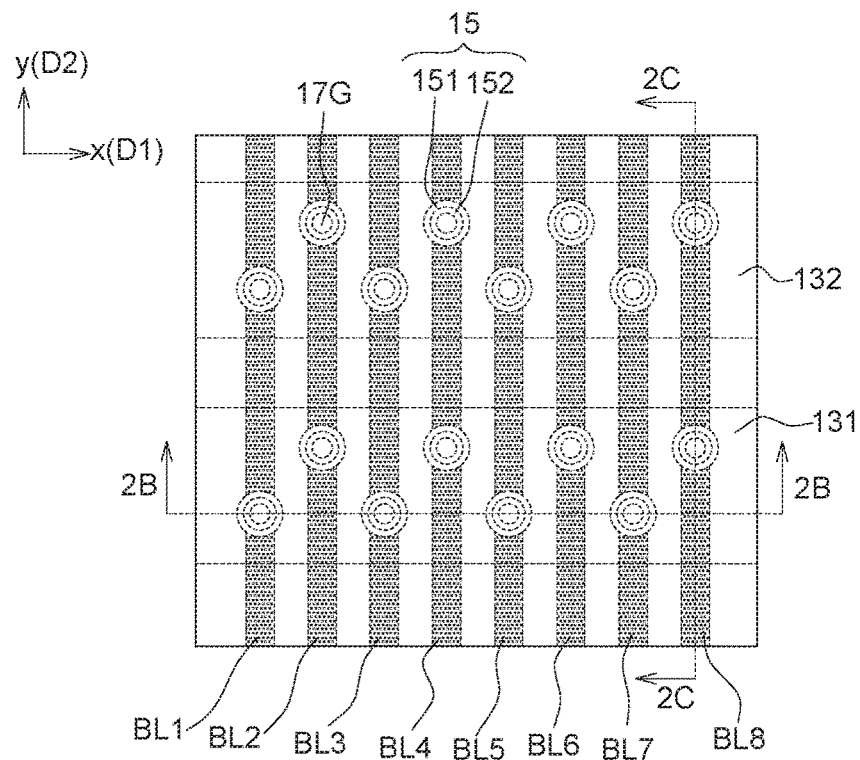
FIG. 2A is a top view of a portion of a 3D semiconductor device according to the first embodiment of the present disclosure.
Figure 2B:
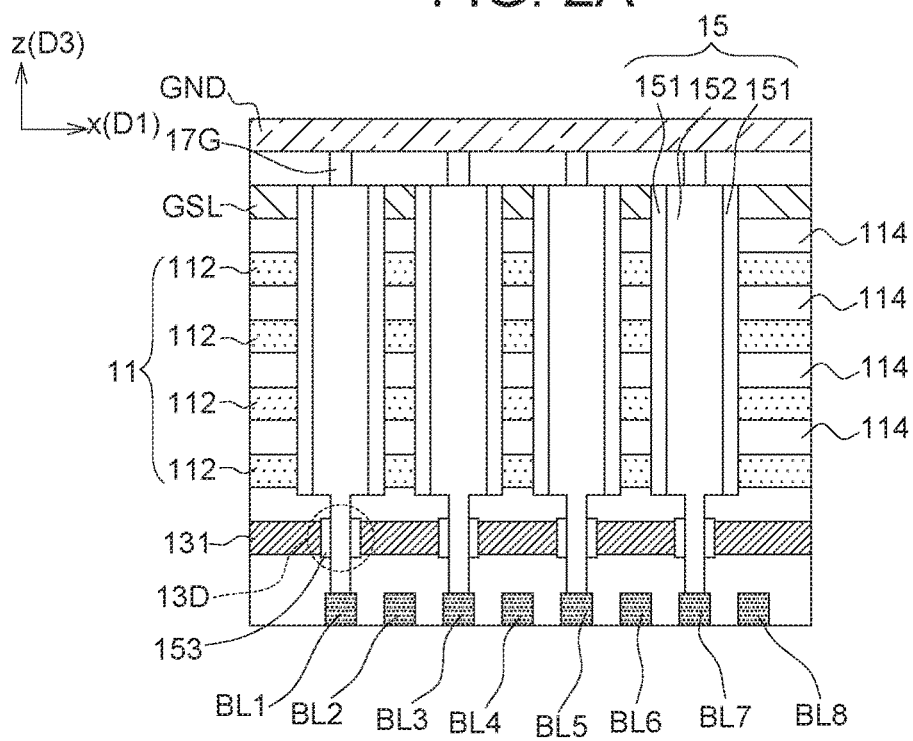
FIG. 2B is a cross-sectional view of the 3D semiconductor device along the cross-sectional line 2B-2B of FIG. 2A.
Figure 2C:
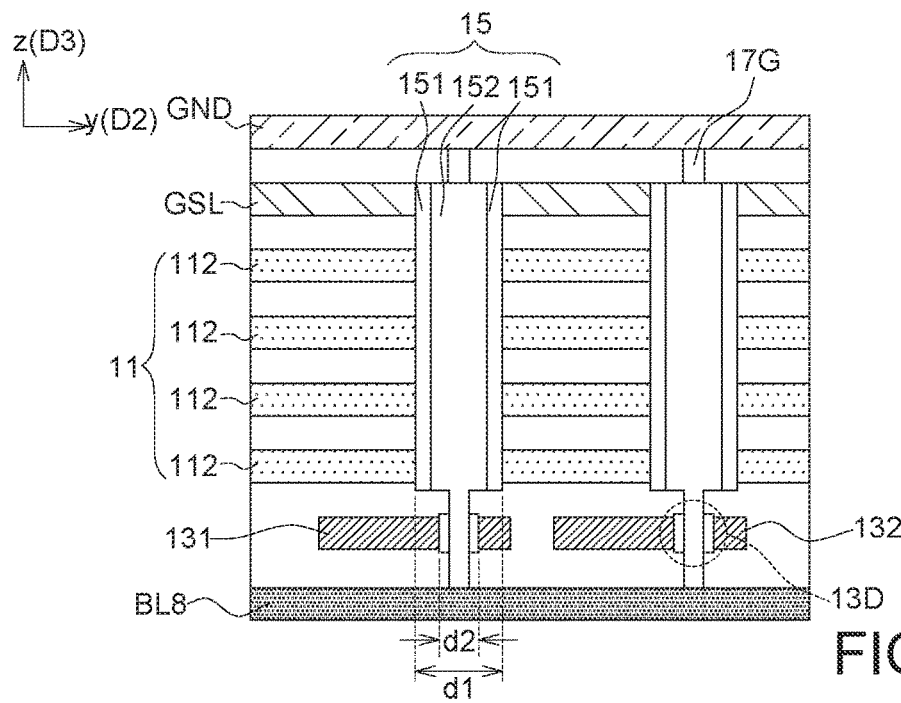
FIG. 2C is a cross-sectional view of the 3D semiconductor device along the cross-sectional line 2C-2C of FIG. 2A.

FIG. 1 simply depicts a perspective view of a three-dimensional (3D) semiconductor device according to the first embodiment of the present disclosure. Please refer to FIG. 1 and FIG. 2A-FIG. 2C. FIG. 2A is a top view of a portion of a 3D semiconductor device according to the first embodiment of the present disclosure. FIG. 2B is a cross-sectional view of the 3D semiconductor device along the cross-sectional line 2B-2B of FIG. 2A. FIG. 2C is a cross-sectional view of the 3D semiconductor device along the cross-sectional line 2C-2C of FIG. 2A. Also, FIG. 2A shows the 3D semiconductor device in a xy-plane, FIG. 2B shows the 3D semiconductor device in an xz-plane, and FIG. 2C shows the 3D semiconductor device in an yz-plane. In the first embodiment, a VC 3D semiconductor device is illustrated for exemplification. It should be noted that some structural details have been omitted from the drawings to improve readability of the Figures.

In the embodiment, a 3D semiconductor device (having vertical-channel 3D array) comprises a plurality of memory layers 11 vertically stacked on a substrate 10, an upper selection layer 12 formed on the memory layers, a lower selection layer 13 formed above the substrate 10, a plurality of strings 15 formed vertically to the memory layers 11 and the substrate 10, and a plurality of bit lines BL1-BL8 disposed above the substrate 10 in parallel to each other, wherein the bit lines BL1-BL8 of the embodiment are disposed beneath the memory layers 11. In the first embodiment, the bit lines BL1-BL8 are positioned between the lower selection layer 13 and the substrate 10.

The memory layers 11 are formed in parallel to each other, and the memory layers 11 include a plurality of conductive layers 112 (such as word lines (WL)) and insulating layers 114 formed alternately (ex: stacked along a third direction D3, i.e. the z-direction). The strings 15 are electrically connected to the upper selection layer 12 and the lower selection layer. Also, each string 15 comprising a channel layer 151 (such as an ONO layer) surrounding a conductive layer 152 is illustrated for exemplifying the embodiment. However, the disclosure is not limited thereto. In the first embodiment, the upper selection layer 12 formed on the memory layers 11 comprises a ground selection line GSL, and the lower selection layer 13 formed under the memory array and above the bit lines BL1-BL8 comprises the string selection lines (SSL) (ex: n of SSLs in a block, n≥2) such as the string selection lines 131 and 132. The 3D semiconductor device of the embodiment further comprises a ground plane GND on the ground selection layer GSL, and the strings 15 are coupled the ground plane GND by ground contacts 17G (as shown in FIG. 2B).

In the first embodiment, the string selection lines 131 and 132 are parallel to each other and extend along a first direction D1 (i.e. x-direction), and the bit lines BL1-BL8 extend along a second direction D2 (i.e. y-direction), wherein the first direction D1 is different from (such as perpendicular to) the second direction D2 (FIG. 1).

Also, a plurality of cells are respectively defined by the strings 15, the string selection lines (such as 131 and 132) and the bit lines (such as BL1-BL8) correspondingly, and the cells are arranged in a plurality of rows and columns. In one embodiment, the adjacent cells in the same column are electrically connected to the same bit line and different string selection lines. For example, the cells in the eighth column are electrically connected to the bit line BL1 but respectively connected to the string selection lines 131 and 132, as shown in FIG. 2C. Accordingly, the strings 15 are electrically connected to the corresponding string selection lines (such as 131 and 132 in FIG. 2A and FIG. 2C).

Also, the strings 15 are electrically connected to the corresponding bit lines (ex: BL1-BL8). For example, as shown in FIG. 2A and FIG. 2B, the strings 15 in the fourth row (FIG. 2A) are electrically connected to the bit lines BL1, BL3, BL5 and BL7, respectively. Each of the strings 15 are controlled by the corresponding SSL device 13D, wherein the SSL device 13D is configured such as by the gate oxides 153 on the sidewalls of the polysilicon end of the string 15 to define a string select gate correspondingly.

Additionally, in one embodiment, the cross-sectional area of the string 15 is larger than the cross-sectional area of the SSL device 13D. As shown in FIG. 2C, the cross-sectional area of the string 15 has a first diameter d1 parallel to the second direction D2 (i.e. y-direction), and the cross-sectional area of the SSL device 13D has a second diameter d2 parallel to the second direction D2 (i.e. y-direction), wherein the first diameter d1 is larger than the second diameter d2. In one embodiment, a ratio of the first diameter d1 to the second diameter d2 (i.e. d1/d2) is in a range of larger than 1.2 to no more than 3 (i.e., 3≥d1/d2>1.2). In one embodiment, a difference between the first diameter d1 and the second diameter d2 (i.e. d1−d2) is equal to or larger than 20, but no more than 80 (i.e. 80 nm≥(d1−d2)>20 nm). In one embodiment, the first diameter d1 is in a range of larger than 80 nm and smaller than 140 nm (i.e. 140 nm>d1>80 nm).

Figure 3A:
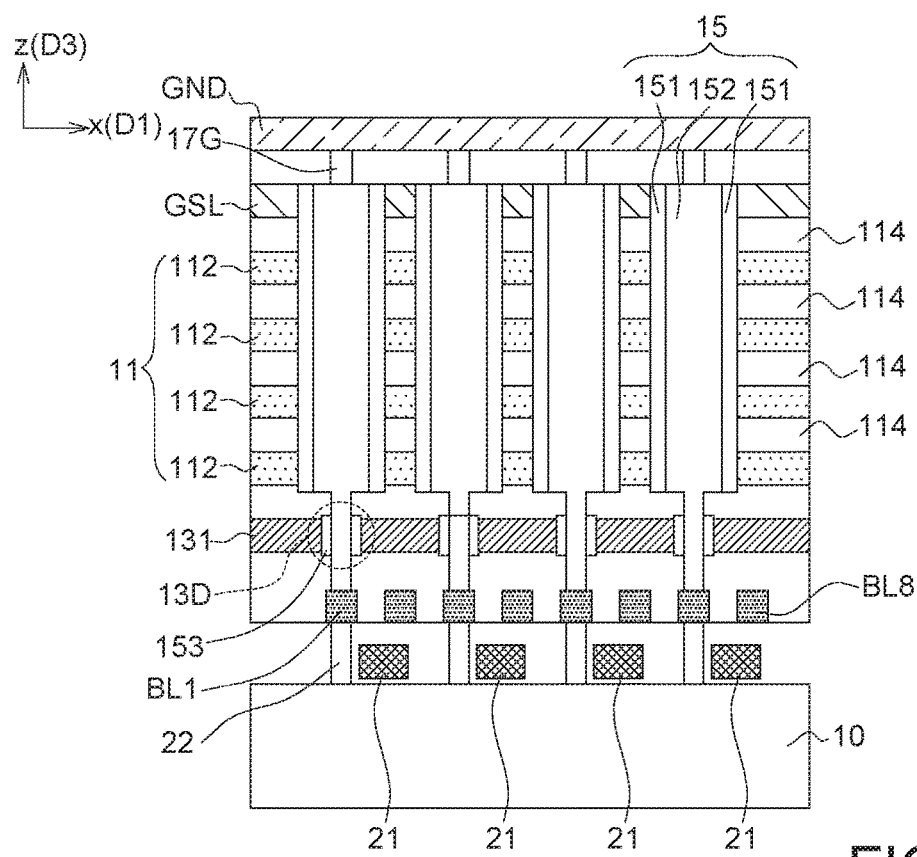
FIG. 3A is a cross-sectional view of a 3D semiconductor device with periphery devices under array in an xz-plane according to the first embodiment of the present disclosure.
Figure 3B:
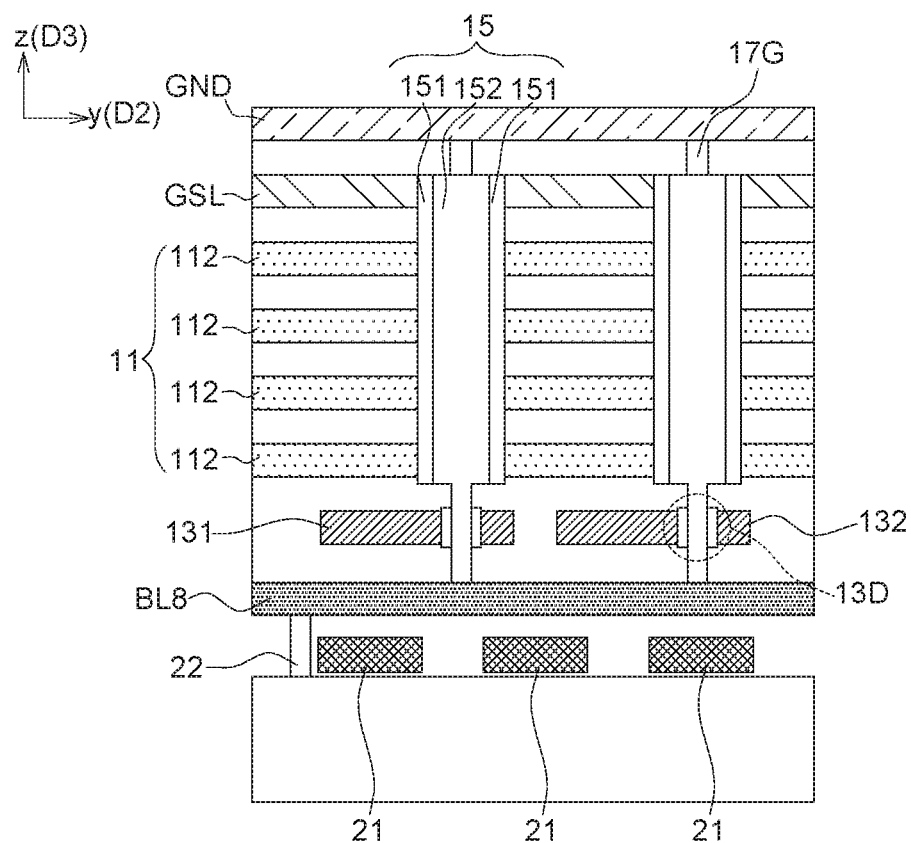
FIG. 3B is a cross-sectional view of the 3D semiconductor device with periphery devices under array in an yz-plane according to the first embodiment of the present disclosure.
Figure 4:
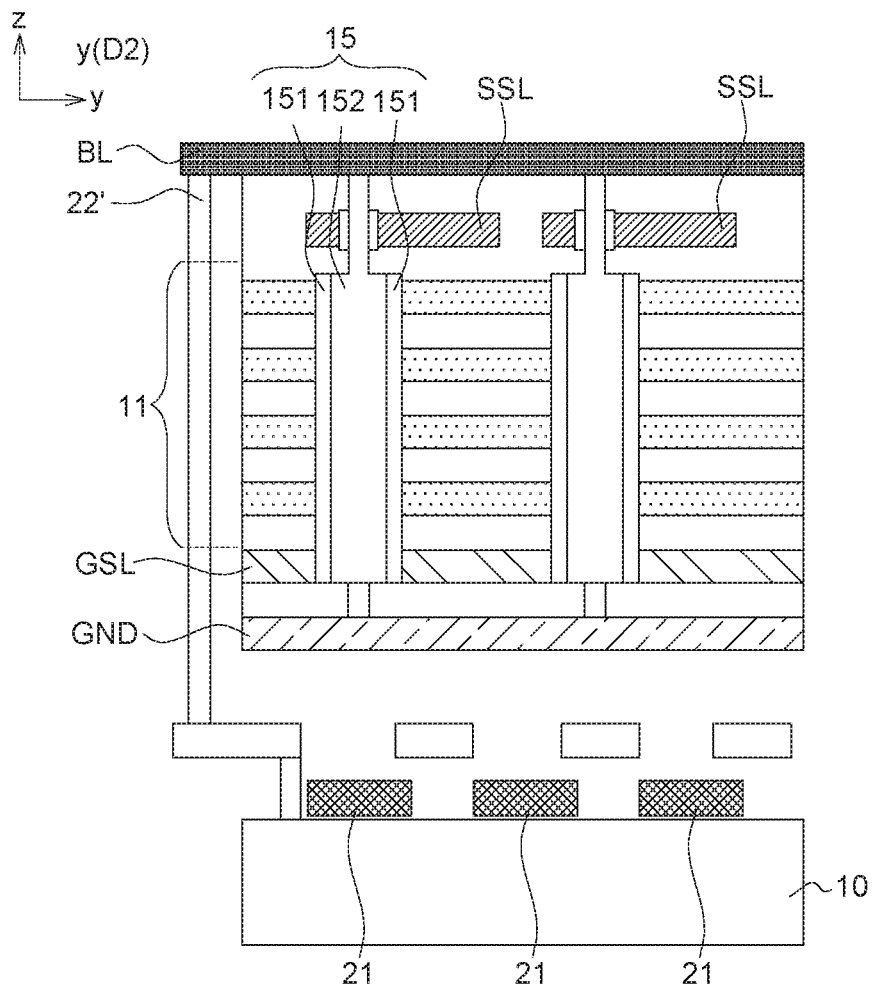
FIG. 4 is a cross-sectional view of a conventional 3D semiconductor device with bit lines upon array and periphery devices under array in an yz-plane.

In the practical applications, the periphery devices can be formed under array of logic cells for saving space originally occupied by the periphery devices. According to the design of the embodiment, the bit lines under array (ex: under the memory layers 11 and the string selection lines 131, 132) would make the connection between the periphery devices and the logic cells in an easier and more reliable way. Please refer to FIG. 3A and FIG. 3B. FIG. 3A is a cross-sectional view of a 3D semiconductor device with periphery devices under array in an xz-plane according to the first embodiment of the present disclosure. FIG. 3B is a cross-sectional view of the 3D semiconductor device with periphery devices under array in an yz-plane according to the first embodiment of the present disclosure. In one application, a 3D semiconductor device of the first embodiment further comprises periphery devices 21 (such as sense amplifiers, x-decoders and/or periphery circuits including page buffers) formed on the substrate 10 and beneath the bit lines (such as BL1-BL8), wherein the bit lines (such as BL1-BL8) are electrically connected to the corresponding periphery devices 21 by the bottom contacts 22. It is of course that the number of the bit lines disposed along the cells in each plane could be more than eight, depending on the requirements of the applications, cost limitation and/or performance of the devices. As shown in FIG. 3A and FIG. 3B, the string selection lines (such as 131 and 132) of the lower selection layer under array are formed above the periphery devices 21, and the bit lines (such as BL1-BL8) are positioned between the string selection lines (such as 131 and 132) and the periphery devices 21. FIG. 4 is a cross-sectional view of a conventional 3D semiconductor device with bit lines upon array and periphery devices under array in an yz-plane. Compared the conventional 3D semiconductor device in FIG. 4 and the embodied 3D semiconductor device in FIG. 3A and FIG. 3B, extra metal layer (such as contact 22' in FIG. 4) and/or more area for connections will be needed in the conventional 3D semiconductor device with bit lines upon array. Besides, the large amount of deep contacts for the page buffer/BL connections would be a great challenge for the manufacturing process. It is noted that some structural details have been omitted from the figures to improve readability of the figures and clarify design of the embodied structure of the semiconductor device; for example, the connection for the ground plane (GND) is not drawn for detail discussion. For the embodied 3D semiconductor device in FIG. 3A and FIG. 3B, the ground plane (GND) also need the deep contacts, but the amount of the deep contacts built in the embodied 3D device (FIG. 3A and FIG. 3B) is much less than that built in the conventional 3D device (FIG. 4).

Figure 5A:
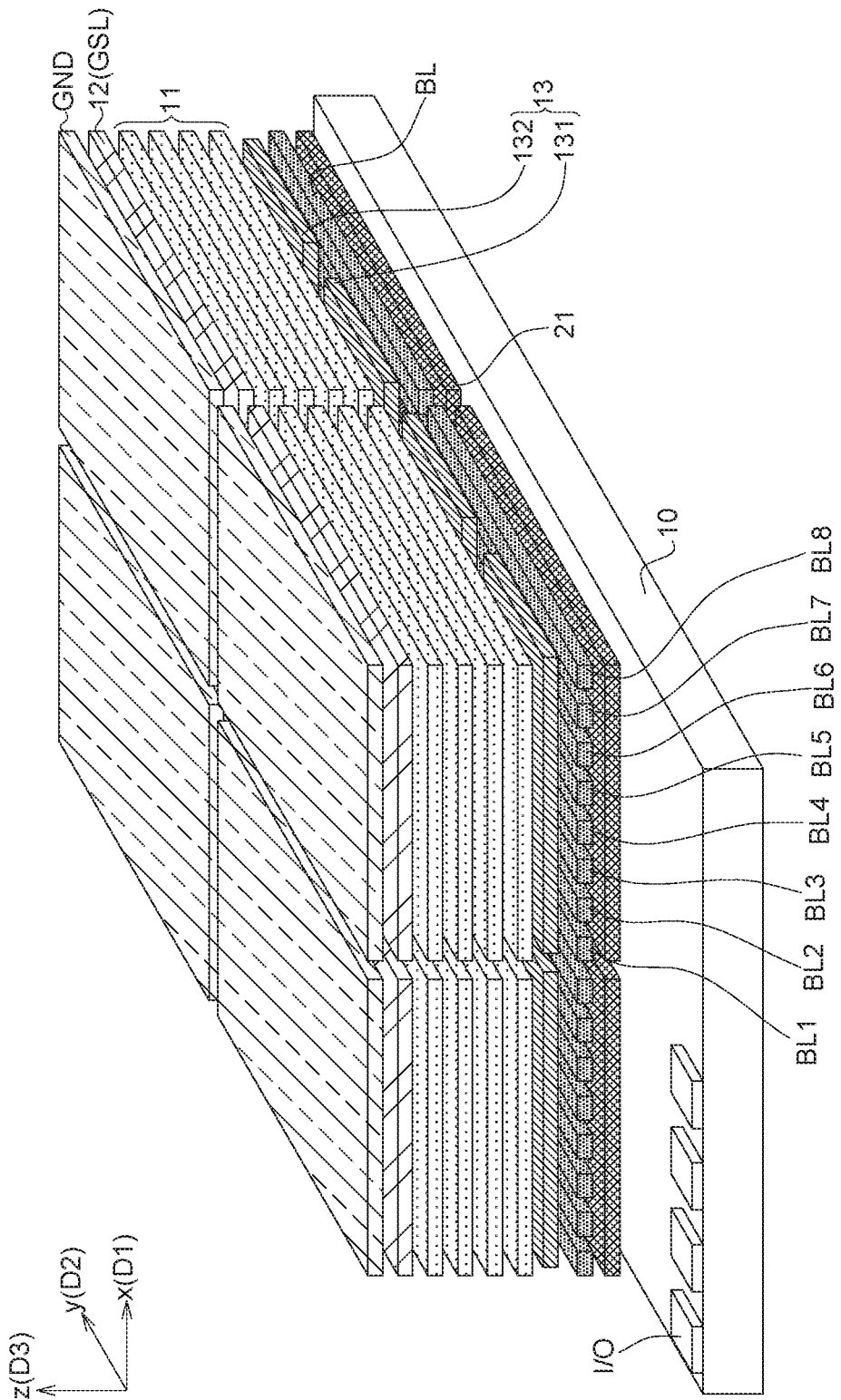
FIG. 5A and FIG. 5B respectively shows a perspective view of a 3D semiconductor device having multiple planes and bit lines/periphery devices under array.
Figure 5B:
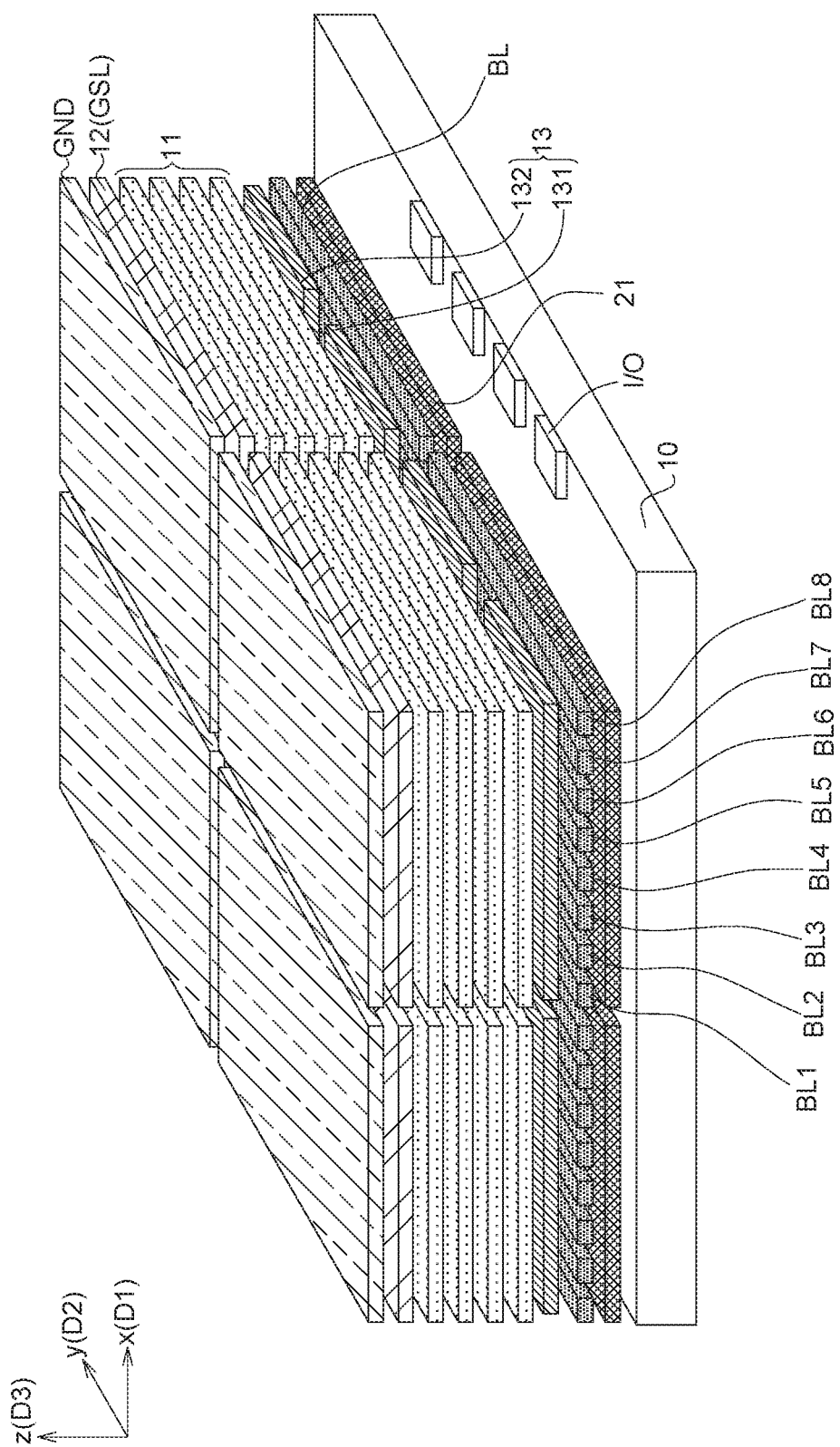

Moreover, a 3D semiconductor device (ex: a 3D NAND memory chip) of the embodiment can be divided into N planes (ex: N≥4), and each plane may have several blocks in the practical application, wherein the 3D semiconductor device may have multiple SSLs in a block. FIG. 5A and FIG. 5B respectively shows a perspective view of a 3D semiconductor device having multiple planes and bit lines/periphery devices under array according to the first embodiment of the present disclosure. In FIG. 5A and FIG. 5B, a 3D semiconductor device having 4 planes of arrays is depicted, wherein one block of one plane and two SSLs in one block are exemplified in the drawings. If one row or two rows of cells are placed on a SSL, the BL pitch can be relaxed. In one embodiment, the BL pitch, $p_{BL}$, of the 3D semiconductor device is in a range of 80 nm to 200 nm (i.e. 200 nm≥p≥80 nm).

The structure of FIG. 5B is identical to the structure of FIG. 5A, except for the arrangement of the input/output pads I/O. In FIG. 5A, the input/output pads I/O are arranged in accordance with the extending direction of the bit lines (ex: set as a straight line parallel to the x-direction). In FIG. 5B, the input/output pads I/O are arranged in accordance with the extending direction of the SSLs(/WL) (ex: set as a straight line parallel to the y-direction). Noted that the identical elements of FIG. 1-FIG. 3B and FIG. 5A-FIG. 5B are designated with the same reference numerals, and the structural details of FIG. 5A and FIG. 5B are not redundantly repeated.

Similarly, the bit lines (such as BL1-BL8) and the SSL 131 and SSL 132 in each plane are positioned beneath the memory layers 11 (i.e. the SSL is placed under the memory array and above the BL), and the periphery devices 21 (such as sense amplifiers, x-decoders and/or periphery circuits including page buffers) in each plane are formed under the bit lines (i.e. between the substrate 10 and the bit lines (such as BL1-BL8). The bit lines in each plane are electrically connected to the corresponding periphery devices 21. As shown in FIG. 5A and FIG. 5B, each plane have it's own periphery devices 21 (such page buffers) underneath, thereby increasing the data rate without too much extra area of the substrate 10.

Second Embodiment

The structures of the first and second embodiments are similar, except for the arrangement and number of the memory arrays. In the first embodiment, the bit lines and SSLs are positioned under a single memory array, wherein the bit lines are near the substrate 10. In the second embodiment, multiple memory arrays, such as an upper memory array and a bottom memory array, are constructed on the bit lines and below the bit lines, respectively.

Figure 6:
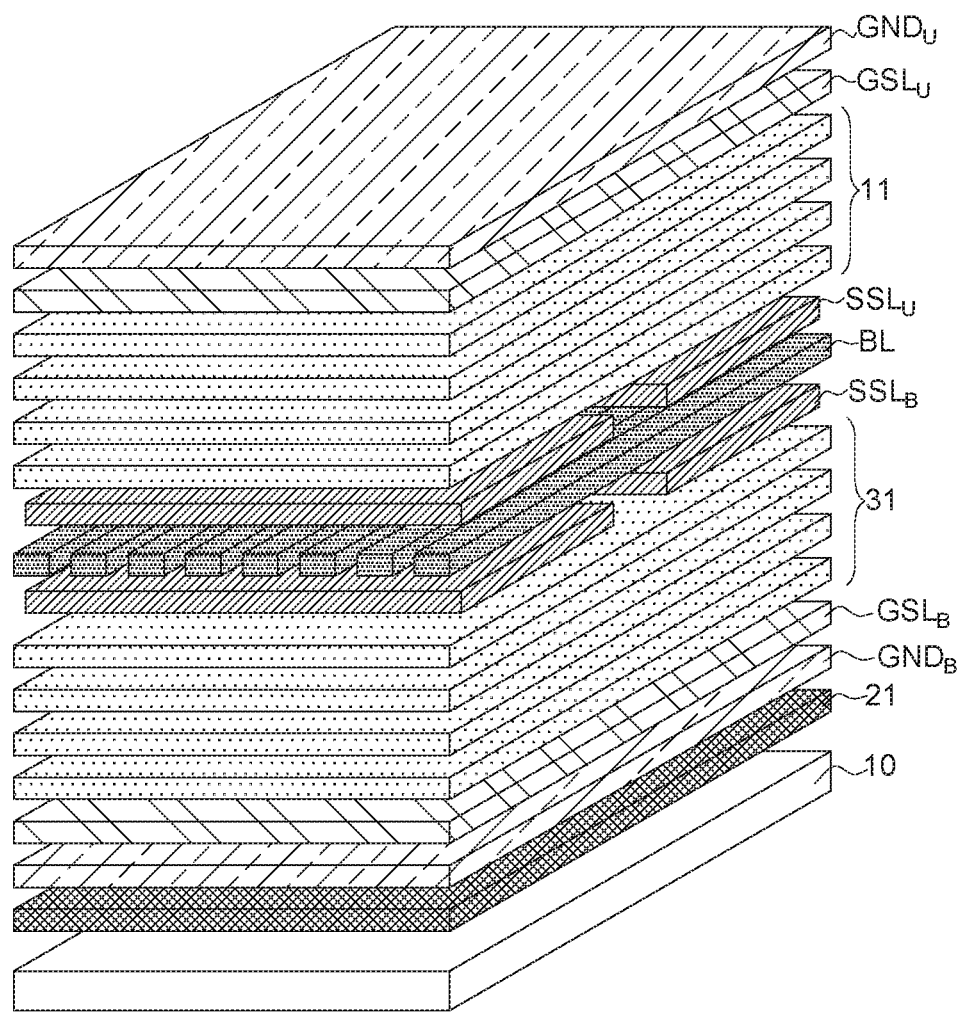
FIG. 6 simply depicts a perspective view of a three-dimensional (3D) semiconductor device according to the second embodiment of the present disclosure.
Figures 1, 7A:
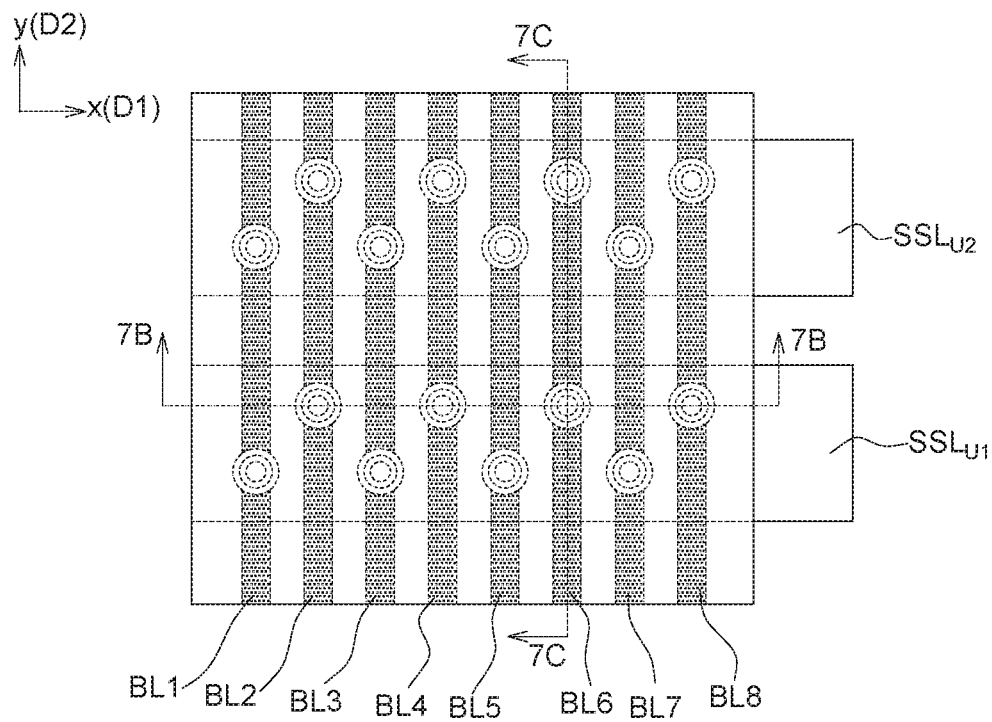
Figures 2, 7A:
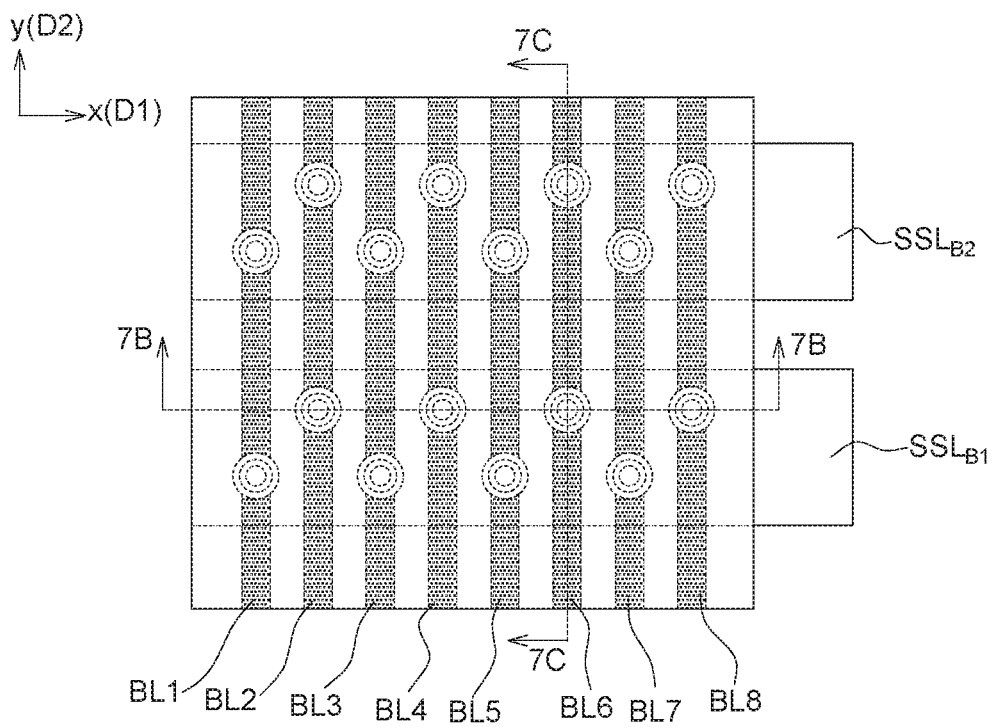
Figure 7B:
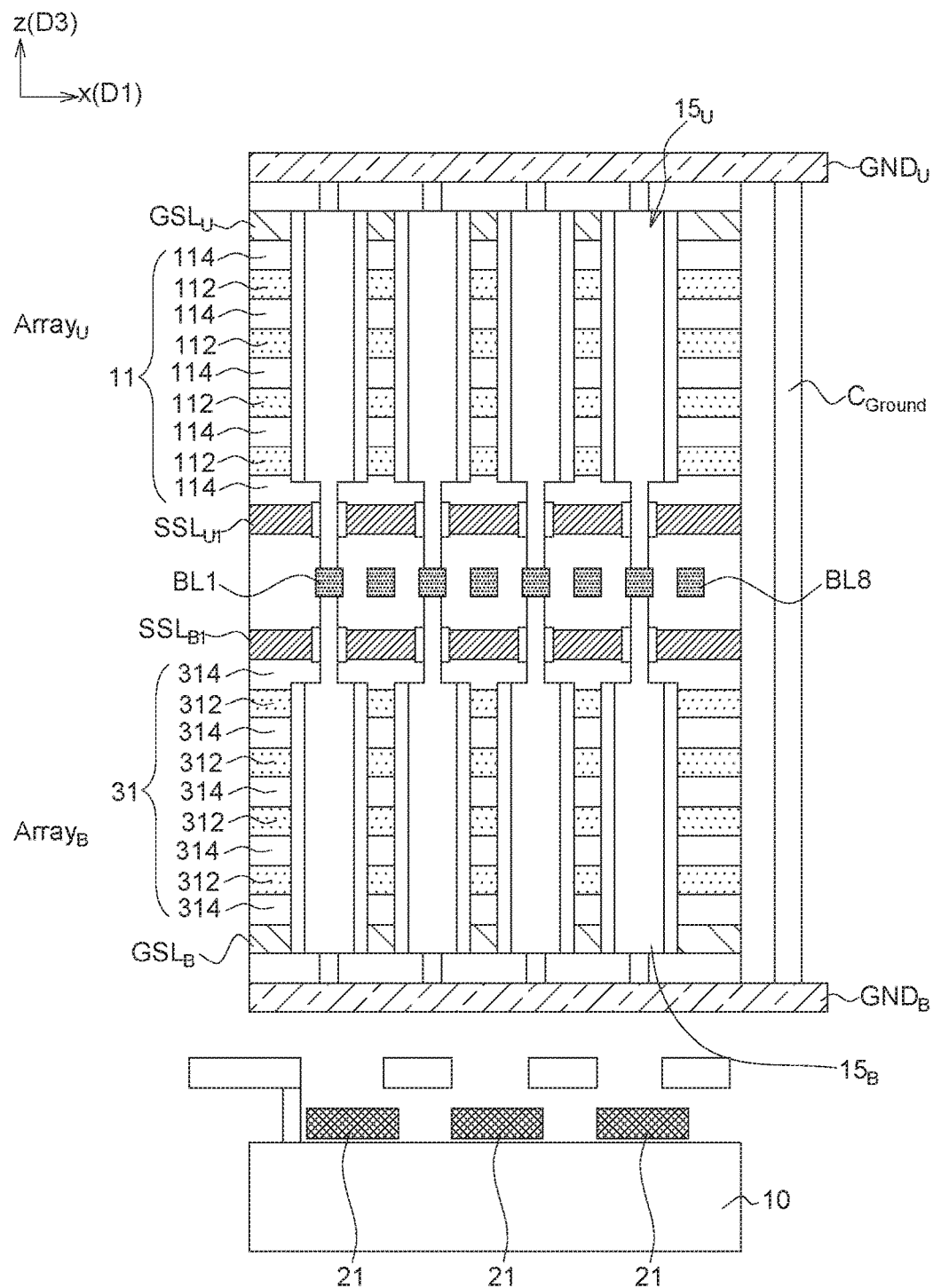
FIG. 7B is a cross-sectional view of the 3D semiconductor device along the cross-sectional line 7B-7B of FIG. 7A-1/FIG. 7A-2.
Figure 7C:
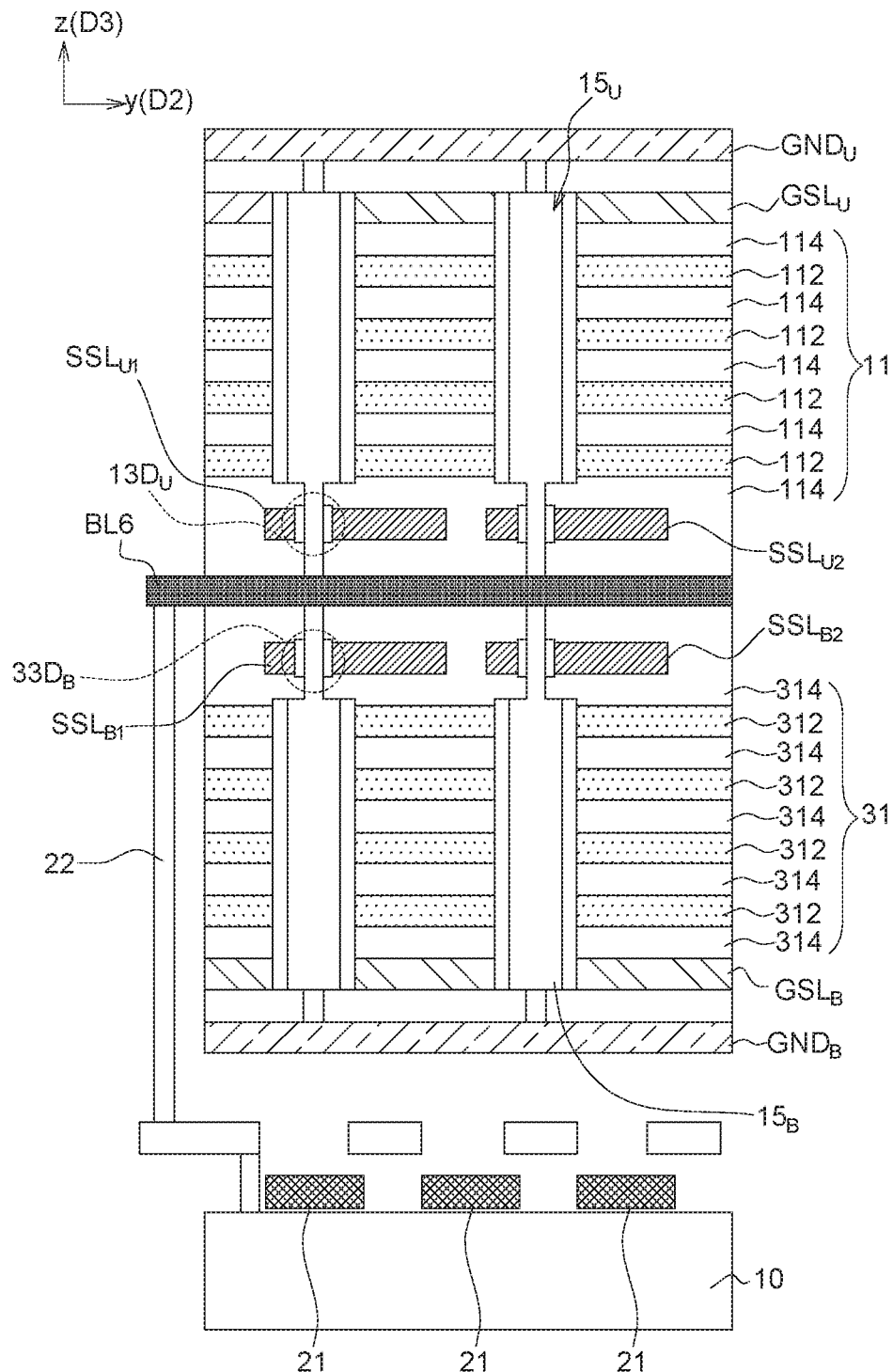
FIG. 7C is a cross-sectional view of the 3D semiconductor device along the cross-sectional line 7C-7C of FIG. 7A-1/FIG. 7A-2.

FIG. 6 simply depicts a perspective view of a three-dimensional (3D) semiconductor device according to the second embodiment of the present disclosure. Please refer to FIG. 6, FIG. 7A-1, FIG. 7A-2, FIG. 7B and FIG. 7C. FIG. 7A-1 and FIG. 7A-2 are top views of the upper memory array and the bottom memory array of a 3D semiconductor device according to the second embodiment of the present disclosure, respectively. FIG. 7B is a cross-sectional view of the 3D semiconductor device along the cross-sectional line 7B-7B of FIG. 7A-1/FIG. 7A-2. FIG. 7C is a cross-sectional view of the 3D semiconductor device along the cross-sectional line 7C-7C of FIG. 7A-1/FIG. 7A-2. Also, FIG. 7A-1 and FIG. 7A-2 show the 3D semiconductor device in a xy-plane, FIG. 7B shows the 3D semiconductor device in an xz-plane, and FIG. 7C shows the 3D semiconductor device in an yz-plane. In the second embodiment, a VC 3D semiconductor device is illustrated for exemplification. In the second embodiment, the upper memory layers 11 and the bottom memory layers 31 are stacked along the third direction D3 (i.e. the z-direction), the upper string selection lines (such as SSLU1 and SSLU2) and the bottom string selection lines (such as SSLB1 and SSLB2) are parallel to each other and extend along the first direction D1 (i.e. x-direction), and the bit lines BL1-BL8 extend along the second direction D2 (i.e. y-direction), wherein the first direction D1 is different from (such as perpendicular to) the second direction D2 (FIG. 6).

It should be noted that some structural details have been omitted from the drawings to improve readability of the Figures, and the identical or similar elements of the drawings in the first and second embodiments are designated with the same or similar reference numerals. Please refer to the descriptions of the first embodiment for the related elements in the second embodiment, and some structural details of FIG. 6-FIG. 7C are not redundantly repeated.

In the second embodiment, the portion above the bit lines BL1-BL8 (i.e. such as the upper memory array Array$_U$, the upper strings 15$_U$, the upper ground selection line GSL$_U$, the upper ground plane GND$_U$, and the upper string selection lines SSL$_{U1}$ and SSL$_{U2}$) can be regarded as the structure of the first embodiment. The structural configuration above the bit lines (such as the upper WLs) and the structural configuration under the bit lines are mirrored with the bit lines. As shown in FIG. 6-FIG. 7C, the portion beneath the bit lines BL1-BL8 includes the bottom string selection lines SSL$_{B1}$ and SSL$_{B2}$ under the bit lines, the bottom memory array Array$_B$, the bottom strings 15$_B$, the bottom ground selection line GSL$_B$ under the bottom memory array, and the bottom ground plane GND$_B$ under the bottom ground selection line GSL$_B$. Accordingly, the structure of the second embodiment can be denoted as an array-BL-array (ABA) structure. Also, the upper string selection lines (such as $SSL_{U1}$ and $SSL_{U2}$) and the bottom string selection lines (such as $SSL_{B1}$ and $SSL_{B2}$) are coupled to the bit lines (such as BL1-BL8) independently.

In one embodiment, the bottom memory array comprises bottom memory layers vertically stacked and parallel to each other. The bottom memory layers 31 include the conductive layers 312 (such as bottom word lines) and the insulating layers 314 formed alternately. Also, the bottom memory array further comprises bottom strings $15_B$ formed vertically to the bottom memory layers 31 and the substrate 10, and the bottom strings $15_B$ electrically connected to the bit lines. Similarly, the bottom strings $15_B$ are electrically connected to the corresponding bottom string selection lines (such as $SSL_{B1}$ and $SSL_{B2}$), and the bottom strings 15e are controlled by the bottom string select gates $33D_U$ on the ends of the bottom strings $15_B$ correspondingly. Also, the periphery devices 21 (such as sense amplifiers, x-decoders and/or periphery circuits including page buffers) are formed under the bit lines (such as BL1-BL8), and positioned between the substrate 10 and the bottom ground plane $GND_B$ as shown in FIG. 6-FIG. 7C, wherein the bit lines (such as BL1-BL8) are electrically connected to the corresponding periphery devices 21 by the bottom contacts 22. Also, the upper ground plane $GND_U$ and the bottom ground plane $GND_B$ are shorted by the ground contacts $C_{ground}$.

Figure 8A:
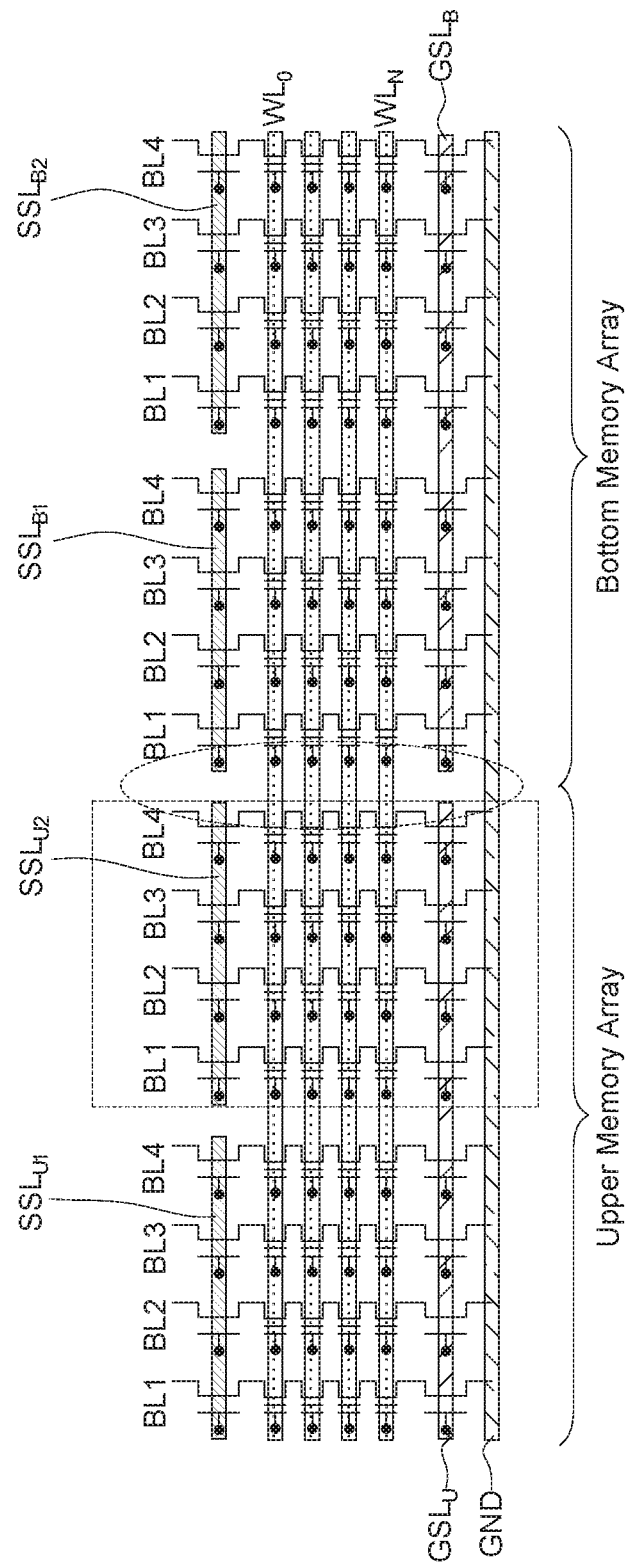
FIG. 8A and FIG. 8B are two types of equivalent circuits of the 3D semiconductor device according to the second embodiment.
Figure 8B:
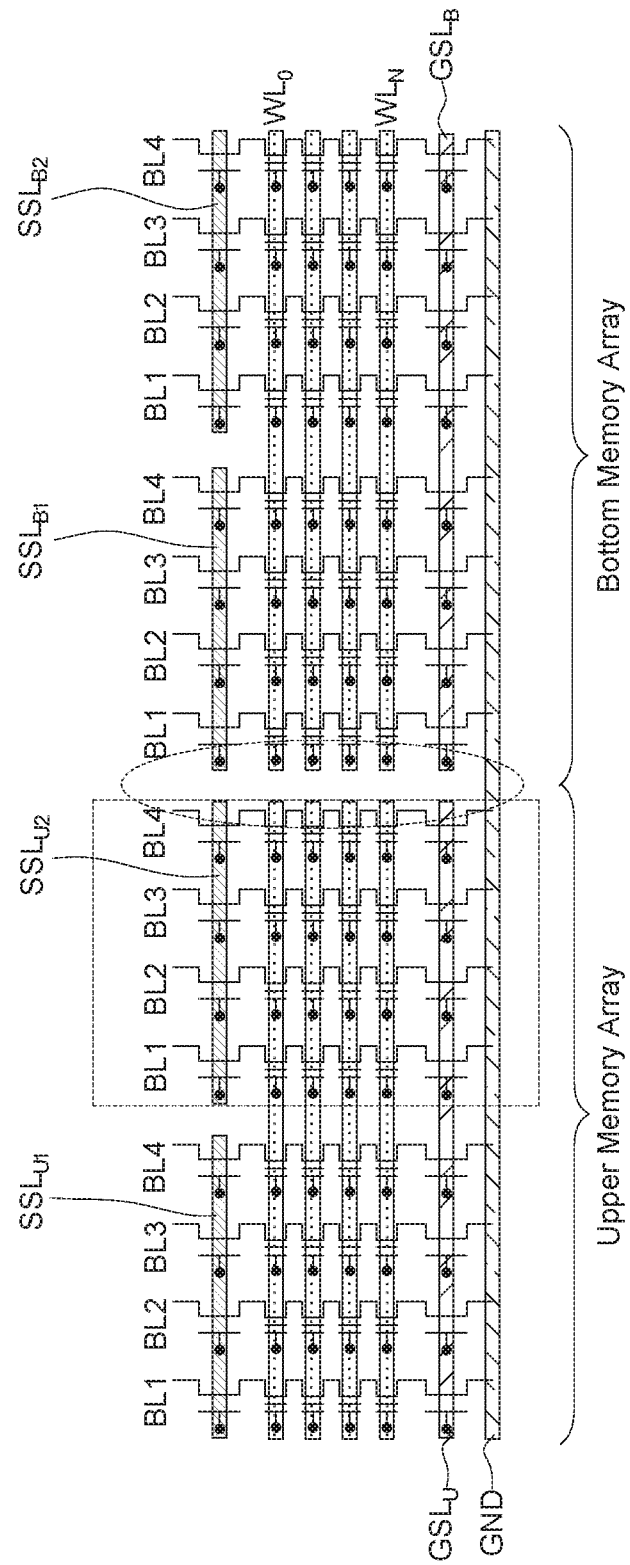

FIG. 8A and FIG. 8B are two types of equivalent circuits of the 3D semiconductor device according to the second embodiment. The periphery devices such as word line (WL) decoder and the page buffer formed under the bit lines/SSL as shown in FIG. 6 are also depicted in FIG. 8A and FIG. 8B. The equivalent circuits of FIG. 8A and FIG. 8B are identical, except for the word line configuration. In FIG. 8A, the upper word lines (i.e. conductive layers 112) and the bottom word lines (i.e. conductive layers 312) are shorted. In FIG. 8B, the upper word lines (i.e. conductive layers 112) and the bottom word lines (i.e. conductive layers 312) are separately controlled. In both equivalent circuits of FIG. 8A and FIG. 8B, the bottom ground selection layer $GSL_B$ formed under the bit lines (such as BL1-BL8) and the upper ground selection layer ($GSL_U$) formed above the bit lines are separated and independently controlled (not-shorted). In the practical applications, if the upper word lines and the bottom word lines use the same local WL driver, which the word lines are shorted, it is good for the cost. If the upper word lines and the bottom word lines use separated local WL driver, it is good for the reliability of operation.

The equivalent circuits and operation of the 3D semiconductor device according to the second embodiment are similar to the typical 3D NAND. One programming method of the cells defined by the $SSL_{U2}$ and the word line $WL_N$ of the upper memory array in FIG. 8A is exemplified for illustration, and the bias conditions including: (1) GND=0, all of GSLs=0, all of WLs=5V, all of SSLs=Vcc, all of BLs=Vcc; and then turn off all SSLs, so all of BLs are charged to Vcc-Vt and floated; (2) selected BL=0, non-selected BLs=Vcc, turn on $SSL_{U2}$, All of WLs=5V, so that all selected BL in $SSL_{U2}$ will be ground, while the others still kept on Vcc-Vt; (3) selected $WL=V_{PGM}$, non-selected $WL=V_{pass}$, wherein the selected cells will be programmed by FN Tunneling, and the non-selected cells will be inhibited by the self-boosting. Also, the upper memory array and the bottom memory array are in the same block, they can be erased at the same time.

According to the design of BL/SSL under array of the 3D semiconductor devices as illustrated in the embodiments above, the BL pitch can be relaxed (such as 200 nm≥p≥80 nm), thereby enlarging the process window, reducing signal interference between the adjacent BLs and simplifying the manufacturing method. Also, in the application of forming the periphery devices under the memory array of the embodiment, it would be much easier to make connection between the BLs and the periphery devices, and less deep contacts are required, which simplifies the manufacturing process and increases the pattern reliability of the product.

It is noted that the devices and cell arrays as described above are provided for illustration. The disclosure is not limited to the configurations disclosed above, and the exemplified structures could be adjusted and changed based on the actual needs of the practical applications. According to the structures of the 3D semiconductor devices as illustrated in the embodiments above, all of the cells can be read at the same time. Additionally, the bandwidth of the 3D semiconductor device can be enlarged (increased), the power consumption can be reduced, and the disturbance between adjacent cells during reading can also be reduced.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A three-dimensional (3D) semiconductor device, comprising:
    a plurality of memory layers vertically stacked above a substrate, and the plurality of memory layers being parallel to each other;
    an upper selection layer formed on the memory layers, and a lower selection layer formed above the substrate;
    a plurality of strings formed vertically to the memory layers and the substrate, and the strings electrically connected to the upper selection layer and the lower selection layer;
    a plurality of bit lines parallel to each other being disposed beneath the memory layers and above the substrate; and
    a plurality of periphery devices formed on the substrate and beneath the bit lines, wherein the periphery devices are sense amplifiers, x-decoders or periphery circuits including page buffers.

2. The 3D semiconductor device according to claim 1, wherein the plurality of bit lines are positioned between the lower selection layer and the substrate.

3. The 3D semiconductor device according to claim 1, wherein the lower selection layer formed under the memory layers comprises a plurality of string selection lines (SSL) parallel to each other, and the plurality of bit lines are positioned under the plurality of string selection lines.

4. The 3D semiconductor device according to claim 3, wherein the upper selection layer formed on the memory layers is a ground selection layer (GSL), and the 3D semiconductor device further comprises a ground plane (GND) on the ground selection layer, and the plurality of strings are electrically connected the ground plane, respectively.

5. The 3D semiconductor device according to claim 4, wherein said string selection lines extend along a first direction, the plurality of bit lines extend along a second direction, and the first direction is perpendicular to the second direction.

6. The 3D semiconductor device according to claim 1, wherein the plurality of bit lines are electrically connected to said periphery devices correspondingly.

7. The 3D semiconductor device according to claim 6, wherein the lower selection layer formed under the memory layers comprises a plurality of string selection lines (SSL) parallel to each other, and the plurality of bit lines are positioned between the plurality of string selection lines and said periphery devices.

8. The 3D semiconductor device according to claim 6, wherein the lower selection layer formed under the memory layers comprises:
   upper string selection lines ($SSL_U$) formed on the plurality of bit lines; and
   bottom string selection lines ($SSL_B$) formed beneath the plurality of bit lines,
   wherein the upper string selection lines and the bottom string selection lines are coupled to the plurality of bit lines independently.

9. The 3D semiconductor device according to claim 8, further comprising a bottom array portion between the plurality of bit lines and said periphery devices, wherein the bottom array portion comprises:
   a plurality of bottom memory layers vertically stacked and parallel to each other;
   a bottom ground selection layer ($GSL_B$) under the plurality of bottom memory layers; and
   a plurality of bottom strings formed vertically to the plurality of bottom memory layers and the substrate, and the plurality of bottom strings electrically connected to the plurality of bit lines,
   wherein the bottom ground selection layer ($GSL_B$) formed under the plurality of bit lines and the a upper ground selection layer ($GSL_U$) of the upper selection layer formed above the plurality of bit lines are separated and independently controlled.

10. The 3D semiconductor device according to claim 9, wherein the bottom string selection lines ($SSL_B$) is formed between the bottom memory layers and the plurality of bit lines.

11. The 3D semiconductor device according to claim 1, wherein a BL pitch of the plurality of bit lines is ranged from 80 nm to 200 nm (200 nm≥p≥80 nm).

12. A three-dimensional (3D) semiconductor device, comprising:
   a plurality of memory layers vertically stacked on a substrate, and the plurality of memory layers being parallel to each other;
   an upper selection layer formed on the memory layers;
   a lower selection layer formed beneath the memory layers and above the substrate;
   a plurality of strings formed vertically to the memory layers and the substrate, and the strings electrically connected to the upper selection layer and the lower selection layer;
   a plurality of bit lines parallel to each other being disposed beneath the memory layers; and
   a plurality of periphery devices formed on the substrate and beneath the bit lines, wherein the periphery devices are sense amplifiers, x-decoders or periphery circuits including page buffers.

13. The 3D semiconductor device according to claim 12, wherein the plurality of bit lines are positioned between the lower selection layer and the substrate.

14. The 3D semiconductor device according to claim 13, wherein the lower selection layer formed under the memory layers comprises a plurality of string selection lines (SSL) parallel to each other, and the plurality of bit lines are positioned under the plurality of string selection lines.

15. The 3D semiconductor device according to claim 14, wherein the upper selection layer formed on the memory layers is a ground selection layer (GSL), and the 3D semiconductor device further comprises a ground plane (GND) on the ground selection layer, and the plurality of strings are electrically connected the ground plane, respectively.

16. The 3D semiconductor device according to claim 15, wherein said string selection lines extend along a first direction, the plurality of bit lines extend along a second direction, and the first direction is perpendicular to the second direction.

17. The 3D semiconductor device according to claim 13, wherein the plurality of bit lines are electrically connected to said periphery devices correspondingly.

18. The 3D semiconductor device according to claim 17, wherein the lower selection layer formed under the memory layers comprises a plurality of string selection lines (SSL) parallel to each other, and the plurality of bit lines are positioned between the plurality of string selection lines and said periphery devices.

19. The 3D semiconductor device according to claim 17, wherein the lower selection layer formed under the memory layers comprises:
   upper string selection lines ($SSL_U$) formed on the plurality of bit lines; and
   bottom string selection lines ($SSL_B$) formed beneath the plurality of bit lines,
   wherein the upper string selection lines and the bottom string selection lines are coupled to the plurality of bit lines independently.

20. The 3D semiconductor device according to claim 19, further comprising a bottom array portion between the plurality of bit lines and said periphery devices, wherein the bottom array portion comprises:
   a plurality of bottom memory layers vertically stacked and parallel to each other;
   a bottom ground selection layer ($GSL_B$) under the plurality of bottom memory layers; and
   a plurality of bottom strings formed vertically to the plurality of bottom memory layers and the substrate, and the plurality of bottom strings electrically connected to the plurality of bit lines,
   wherein the bottom ground selection layer ($GSL_B$) formed under the plurality of bit lines and the a upper ground selection layer ($GSL_U$) of the upper selection layer formed above the plurality of bit lines are separated and independently controlled.

21. The 3D semiconductor device according to claim 20, wherein the bottom string selection lines ($SSL_B$) is formed between the bottom memory layers and the plurality of bit lines.

22. The 3D semiconductor device according to claim 13, wherein a BL pitch of the plurality of bit lines is ranged from 80 nm to 200 nm (200 nm≥p≥80 nm).

* * * * *